United States Patent [19]
Manning

[11] Patent Number: 6,094,727
[45] Date of Patent: Jul. 25, 2000

[54] METHOD AND APPARATUS FOR CONTROLLING THE DATA RATE OF A CLOCKING CIRCUIT

[75] Inventor: Troy A. Manning, Boise, Id.

[73] Assignee: Micron Technology, Inc., Boise, Id.

[21] Appl. No.: 09/103,628

[22] Filed: Jun. 23, 1998

[51] Int. Cl.[7] .................................................. G06F 1/06
[52] U.S. Cl. ............................ 713/400; 713/501; 713/600
[58] Field of Search ................................... 713/400, 401, 713/500, 501, 503, 600

[56] References Cited

U.S. PATENT DOCUMENTS

| | | | |
|---|---|---|---|
| 4,527,075 | 7/1985 | Zbinden | 307/265 |
| 5,128,560 | 7/1992 | Chern et al. | 307/475 |
| 5,128,563 | 7/1992 | Hush et al. | 307/482 |
| 5,165,046 | 11/1992 | Hesson | 307/270 |
| 5,274,276 | 12/1993 | Casper et al. | 307/443 |
| 5,329,186 | 7/1994 | Hush et al. | 307/482 |
| 5,347,179 | 9/1994 | Casper et al. | 307/451 |
| 5,349,247 | 9/1994 | Hush et al. | 307/451 |
| 5,410,683 | 4/1995 | Al-Khairi | 713/501 |
| 5,564,042 | 10/1996 | Ventrone et al. | 713/501 |
| 5,614,855 | 3/1997 | Lee et al. | 327/158 |
| 5,627,487 | 5/1997 | Keeth | 327/112 |
| 5,758,134 | 5/1998 | Imel et al. | 713/501 |
| 5,867,453 | 2/1999 | Wang et al. | 368/120 |
| 5,874,845 | 2/1999 | Hynes | 327/259 |
| 5,877,636 | 3/1999 | Truong et al. | 327/99 |
| 6,016,548 | 1/2000 | Nakamura et al. | 713/323 |

OTHER PUBLICATIONS

Descriptive literature entitled, "400MHz SL.DRAM, 4M×16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc. New York, NY, pp. 1–56.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

*Primary Examiner*—Dennis M. Butler
*Attorney, Agent, or Firm*—Dorsey & Whitney LLP

[57] ABSTRACT

A data rate control circuit that is programmable between a first data rate and a second data rate. The data rate control circuit is formed by a clocking circuit and a switching circuit. The clocking circuit receives a first clock signal on a first input line and has a second input line which receives either the second clock signal or a steady state voltage. The switching circuit selectively couples the second clock signal or the steady state voltage to the clocking circuit. When the clocking circuit receives the second clock signal, the clocking circuit clocks at a double data rate, and when the clocking circuit receives the steady state voltage, the clocking circuit clocks at a single data rate. The switching circuit includes a switch that switches the output signal between the second clock signal and the steady state voltage. The clocking circuit can be any of many circuits known to those skilled in the art including a shift register or counter latch.

69 Claims, 8 Drawing Sheets

6,094,727

METHOD AND APPARATUS FOR CONTROLLING THE DATA RATE OF A CLOCKING CIRCUIT

TECHNICAL FIELD

This invention relates generally to clocking circuits and more particularly, to a method and apparatus for controlling the data rate of a clocking circuit.

BACKGROUND OF THE INVENTION

Communications between electrical circuits generally require that the circuit receiving the data must be able to receive the data at the same rate and time that the sending circuit transmits it. Discrepancies in the data rate or time of communication between the two circuits can lead to errors or loss of data.

Clocking circuits have traditionally operated at one of two classes of data rates: a single data rate, clocking on one edge of a primary clock, or a double data rate, clocking on both edges of the primary clock. This results in three types of circuits: a circuit that clocks on the rising edge of the primary clock, a circuit that clocks on the falling edge, or a circuit that clocks on both rising and falling edges.

Problems can arise when a circuit of one type tries to communicate with a circuit of another type. In one situation, the transmitting circuit attempts to transfer data at a different rate than the receiving circuit can handle, such as a double data rate processor circuit transmitting to a single data rate SDRAM. When the transmitting circuit transfers data at a faster rate than the receiving circuit can handle, the receiving circuit can miss portions of the data. For example, if a transmitting circuit transmits data at a rate of 66 MHz, while the receiving circuit receives data at 33 MHz, the receiving circuit will at best receive half of the data transmitted (rate of data received/rate of data sent=33 MHz/66 MHz=½).

In another situation, the receiving circuit may only "read" the data at a given point in time, and for a given duration. If the data is not present during that time, it may not be received. Here, the transmitting circuit may transmit data on one edge of the primary clock, such as the rising edge, while the receiving circuit "reads" the data on the other edge of the clock, such as the falling edge.

One solution to this problem is the addition of a latch circuit between the transmitting circuit and the receiving circuit. A latch maintains a data signal until it is overwritten by a new data signal. Thus, data can be held until the receiving circuit is ready to "read" it. The problem with this solution is that this requires additional circuitry; circuitry that takes up space and requires additional power. This is the antithesis of the goals of modern circuit design, which is to minimize the amount of circuitry and power usage.

These problems are particularly prevalent for communications in a synchronous dynamic random access memory (SDRAM). A SDRAM can use all or some of the three clocking protocols discussed above: clocking on the rising edge of a clock signal, the falling edge, or both edges. Similarly, a processor, or more specifically, a memory controller, that communicates with and controls the SDRAM can use all or some of the same three clocking protocols. In order for a given SDRAM to efficiently communicate with a given memory controller, the two circuits must use the same clocking protocol, sending and receiving data at the same rate and time, i.e., both clocking on the same edge or edges of the same clock signal. Thus, the need to match clocking protocols limits the memory controllers that can be used with a given SDRAM.

In the past, proper communication between a given memory controller and the SDRAM has been ensured by producing several types of SDRAMs, each of which uses a single clocking protocol. This solution, however, requires that several different types of SDRAMs and compatible memory controllers be available, and results in an unnecessarily expanded product line by manufacturers and sellers of SDRAMs and memory controllers.

Therefore, there is a need for a single SDRAM or clocking circuit that is capable of operating on either or both edges of a clock signal, for communications with memory controllers having varying data rates and times of communication.

SUMMARY OF THE INVENTION

The present invention provides a method and apparatus for producing a programmable clocking circuit that is capable of operating at either a single data rate or a double data rate and on either the rising or falling edge of a clock signal. A single data rate circuit is a circuit that clocks once per clock cycle, typically on only one edge of a clock signal (rising or falling), while a double data rate circuit clocks twice per clock cycle, typically on both edges (rising and falling) of a clock signal. The double data rate circuit clocks twice as often as the single data rate circuit, hence the name. According to one embodiment of the invention, a clocking circuit receives a first clock signal, and a switching circuit receives a second clock signal. The switching circuit is programmable to couple either the first clock signal to the clocking circuit or a steady state voltage to the clocking circuit. The clocking circuit is structured to clock on the transitions of the first clock signal to both logic levels, typically a logic zero and logic one, in response to receiving the second clock signal from the switching circuit, and clocking on the transition of the first clock signal to only one logic level in response to receiving the steady state voltage from the switching circuit. The data rate and time for communication for the clocking circuit can then be selected by programming the switching circuit to either couple the second clock signal or the steady state voltage to the clocking circuit.

DETAILED DESCRIPTION OF THE INVENTION

Figure 1:
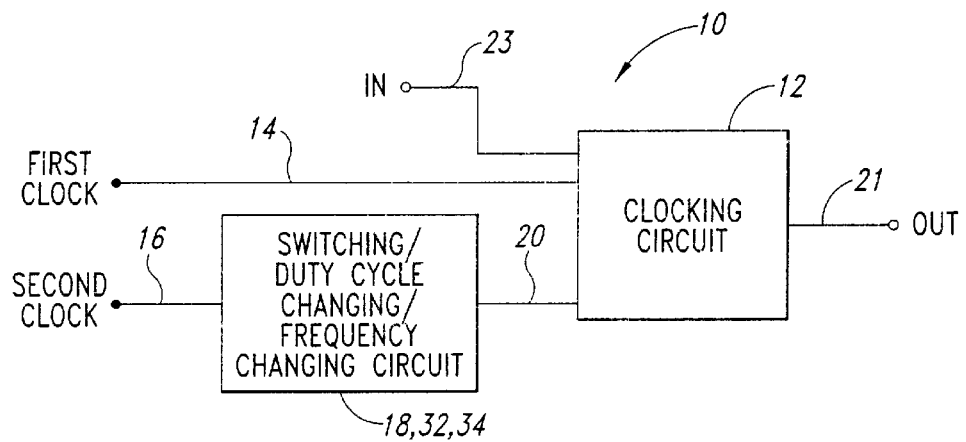
FIG. 1. is a functional block diagram of a data rate control circuit in accordance with one embodiment of the invention.

FIG. 1 is a functional block diagram of an embodiment of the data rate control circuit 10 in accordance with the invention. The data rate control circuit 10 includes a clocking circuit 12, a first clock line 14, a second clock line 16, a switching circuit 18, and a first output line 20. The clocking circuit 12 receives a first clock signal that transitions between two logic levels, such as a logic zero and a logic one, on the first clock line 14. The first clock signal has a first frequency and a first phase. The switching circuit 18 receives a second clock signal having the first frequency and a second phase on the second clock line 16. Typically the second clock signal is a quadrature clock, being 90 degrees out of phase with the first clock signal.

The switching circuit 18 operates in two modes, a first mode where the switching circuit 18 couples the second clock signal to the clocking circuit 12 through the first output line 20, and a second mode where the switching circuit 18 couples a steady state voltage to the clocking circuit 12 through the first output line 20. The clocking circuit 12 clocks on transitions of the first clock signal to both logic levels when the clocking circuit 12 receives the second clock signal from the switching circuit 18, and clocks on transitions of the first clock signal to only one logic level when the clocking circuit 12 receives the steady state voltage from the switching circuit 18. The steady state voltage that is applied on the first output line 20 to the clocking circuit 12 is typically a positive voltage, such as $V_{cc}$, but may also be 0 volts, ground, or any other suitable voltage.

Figure 7:
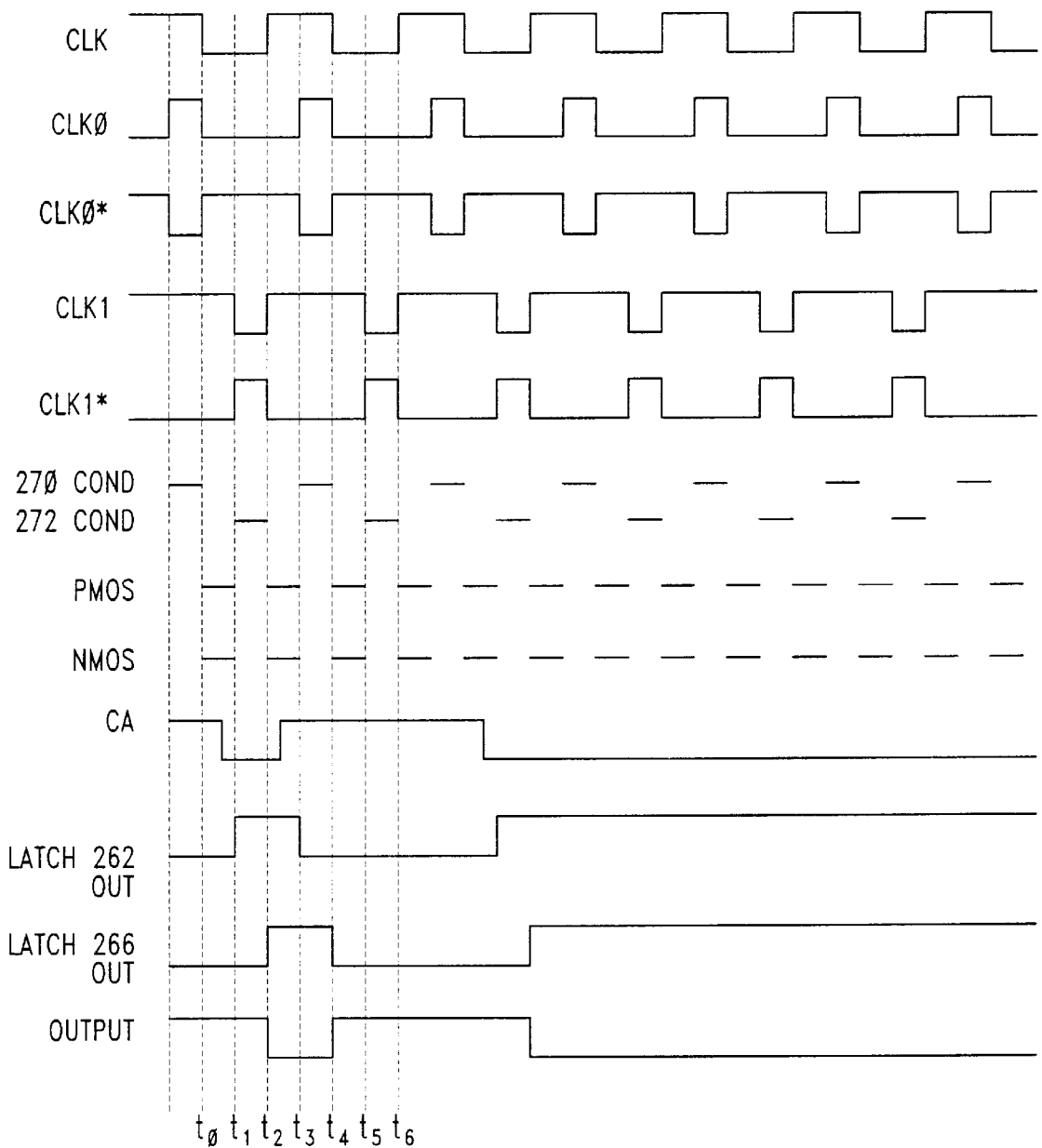
FIG. 7 is a timing diagram showing various signals present in the shift register of FIG. 6 when operating in a double data rate mode.

In one embodiment, the clocking circuit 12 may be a circuit that performs a predetermined function each time the clocking circuit 12 clocks, such as a shift register shown in FIG. 7 of U.S. patent application No. 08/813,041, which is incorporated herein by reference. The clocking circuit may also be a counter latch, or one of many other circuits known by those skilled in the art. Accordingly, the clocking circuit 12 may produce an output signal on a clocking output line 21 responsive to receiving an input signal on a clocking input line 23.

In another embodiment, when the steady state voltage is applied on the first output line 20 to the clocking circuit 12, the clocking circuit 12 clocks on transitions of the first clock signal to a logic one logic level. The steady state voltage is typically a relatively high voltage, such as a logic one, or $V_{cc}$. In another embodiment, the clocking circuit 12 clocks on only transitions of the first clock signal to a logic zero logic level in response to receiving the steady state voltage on the first output line 20. The steady state voltage is typically a relatively low voltage, such as a logic zero, or ground.

Thus, the data rate control circuit 10 functions as a double data rate circuit when the clocking circuit 12 receives the second clock signal on the first output line 20, and a single data rate circuit when the clocking circuit 12 receives the steady state voltage on the first output line 20. When acting as a single data rate circuit, the data rate control circuit 10 is programmable to clock on the transition of the first clock signal to a relatively high voltage by using a relatively high steady state voltage, and is programmable to clock on the transition of the first clock signal to a relatively low voltage by using a relatively low steady state voltage.

Figure 2A:
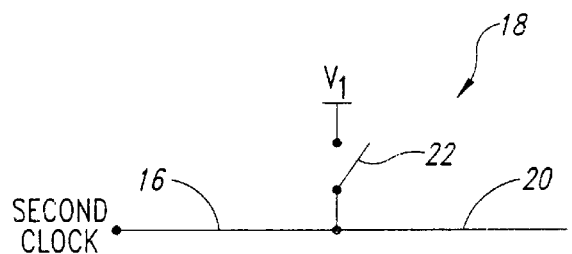
FIG. 2A is a schematic diagram of an embodiment of the switching circuit shown in FIG. 1.
Figure 2B:
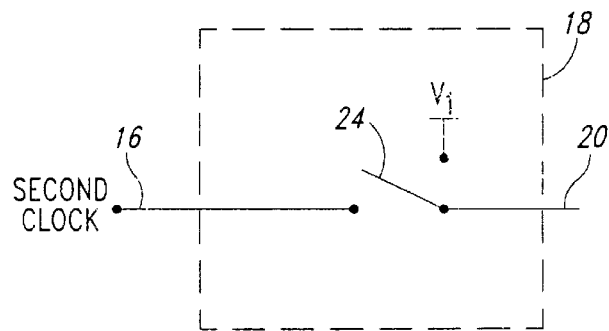
FIG. 2B is a schematic diagram of another embodiment of the switching circuit shown in FIG. 1.

In one embodiment of the switching circuit 18, the switching circuit 18 is made up of a switching element that is selectively programmable to couple the steady state voltage source to the first output line 20. This can be accomplished with a switch 22 placed between the steady state voltage source and the first output line 20 as shown in FIG. 2A. This embodiment relies on the voltage from the steady state voltage source to bias the first output line 20 to the steady state voltage, despite the second clock signal that is already present on the first output line 20. Methods for accomplishing this are known to those skilled in the art. Alternately, a switch 24 can be such as shown in FIG. 2B, having two positions, one connected to the second clock line 16 and one connected to the steady state voltage, with the switch 24 decoupling the first output line 20 from the position that the switch 24 is not coupled to.

Figure 2C:
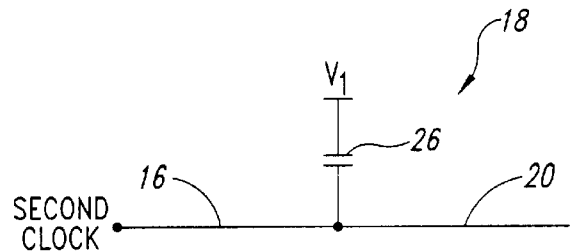
FIG. 2C is a schematic diagram of another embodiment of the switching circuit shown in FIG. 1.
Figure 2D:
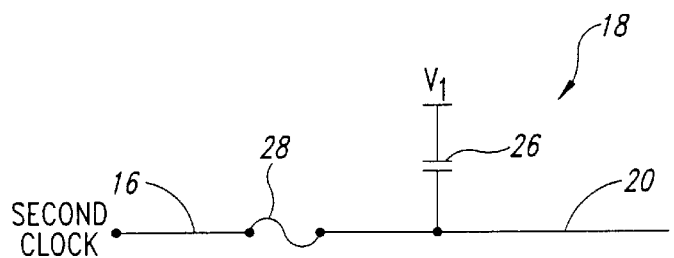
FIG. 2D is a schematic diagram of another embodiment of the switching circuit shown in FIG. 1.

Similarly, an antifuse 26, as shown in FIG. 2C, may be used to couple the steady state voltage to the first output line 20. The antifuse 26 is placed between the steady state voltage and the first output line 20. By blowing the antifuse 26, the steady state voltage supply is coupled to the first output line 20. Again, this configuration requires the steady state voltage to bias the output line 20 despite the second clock signal which is also present on the first output line 20. Alternately, as shown in FIG. 2D, a fuse 28 or other decoupling device may be placed between the second clock line 16 and the output line 20, and the fuse 28 can be blown in conjunction with blowing the antifuse 26 such that the steady state voltage is coupled to the first output line 20 by the blown antifuse 26, and the second clock signal that is present on the second clock line 16 is decoupled from the first output line 20 by the blown fuse 28. Those skilled in the art will recognize that other methods can be used to decouple the second clock signal from the first output line 20.

Figure 2E:
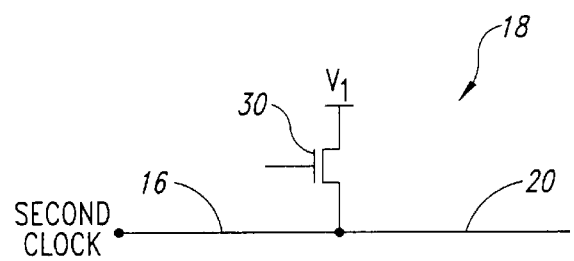
FIG. 2E is a schematic diagram of another embodiment of the switching circuit shown in FIG. 1.

In another embodiment of the switching circuit 18, shown in FIG. 2E, a transistor 30 may be placed with its input terminal connected to the steady state voltage source, its output terminal connected to the output line 20, and its control terminal selectively enabled or disabled, thereby coupling or decoupling the steady state voltage from the output line 20. The second clock line 16 can be decoupled from the output line 20 when the steady state voltage is coupled to the output line 20 by the methods described above, or by other methods that are well known in the art,.

In an alternate embodiment of the data rate control circuit 10 shown in FIG. 1, a duty cycle changing circuit 32 may be substituted for the switching circuit 18. In this embodiment the clocking circuit 12 clocks on both edges of the first clock signal in response to receiving a signal on the output line 20 having a first duty cycle, typically 50%, and clocks only one edge of the first clock signal in response to receiving a signal on the output line 20 having a second duty cycle, typically 100% or 0%.

In this embodiment, the first and second clock signals each have a rising edge and a falling edge, and the clocking circuit 12 clocks on only the rising edge of the first clock signal in response to receiving a signal on the output line 20 having the second duty cycle, typically 100%. This results in a single data rate circuit clocking on only the rising edge of the primary clock. Alternately, the clocking circuit 12 can clock on the falling edge of the first clock signal in response to receiving a signal on the output line 20 having the second duty cycle, typically 0%. This results in a single data rate circuit clocking on only the falling edge of the primary circuit.

In both of these embodiments when the clocking circuit 12 receives a signal on the output line 20 having the first duty cycle, the clocking circuit 12 clocks on both the rising and falling edges of the first clock signal, causing the clocking circuit 12 to function as a double data rate circuit. These embodiments function similarly to the embodiment shown in FIG. 1 in most other ways, and may be implemented as shown in FIGS. 2a–e and described above. Further explanation is omitted in the interest of brevity.

Another embodiment of the data rate control circuit 10 uses a frequency changing circuit 34 in place of the switching circuit 18. In this embodiment, the clocking circuit clocks on both edges of the first clock signal in response to receiving a signal on the output line 20 having a first frequency, and clocks on only one edge of the first clock signal in response to receiving a signal on the output line 20 having a second frequency. Typically, the second clock signal has the first frequency, and the voltage source has the second frequency.

In this embodiment, the first frequency is typically a positive number, and the second frequency is typically zero. As in the embodiment with the duty cycle changing circuit described above, the first and second clock signals have first edges and second edges, which can be rising and falling edges.

Thus, the clocking circuit 12 can be programmed with the use of the frequency changing circuit to clock on only the rising edge of the first clock signal in response to receiving a signal on the output line 20 having the second frequency and a relatively high magnitude of voltage. The clocking circuit 12 can also be programmed to clock on only the falling edge of the first clock signal in response to receiving a signal on the output line 20 having the second frequency and a relatively low magnitude of voltage. These embodiments function similarly to the embodiment shown in FIG. 1 in most other ways, and may be implemented as shown in FIGS. 2A–e and as described above. Further explanation is omitted in the interest of brevity.

Thus, when the clocking circuit 12 receives a signal on the output line 20 having the first frequency, the clocking circuit 12 clocks on both the rising and falling edges of the first clock signal, causing the clocking circuit 12 to function as a double data rate circuit. When the clocking circuit 12 receives a signal on the output line 20 having the second frequency and a relatively high magnitude of voltage, the clocking circuit 12 functions as a single data rate circuit clocking on the rising edge of the first clock signal. When the clocking circuit 12 receives a signal on the output line 20 having the second frequency and a relatively low magnitude of voltage, the clocking circuit 12 functions as a single data rate circuit clocking on the falling edge of the first clock signal.

Figure 3:
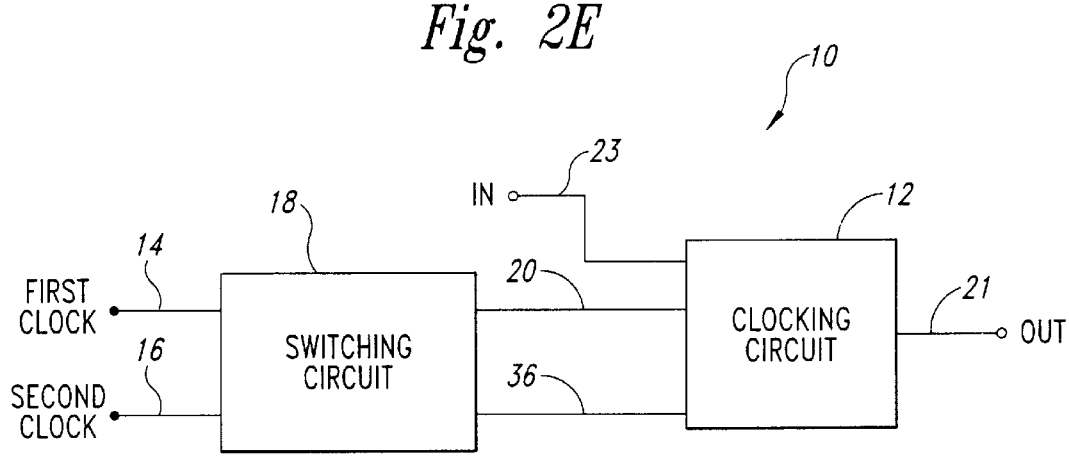
FIG. 3 is a functional block diagram of another embodiment of a data rate control circuit in accordance with the invention.

Another embodiment of the data rate control circuit is shown in FIG. 3. The data rate control circuit 10 includes a clocking circuit 12, a first clock signal line 14, a second clock signal line 16, a switching circuit 18, a first output line 20, and a second output line 36. A first clock signal is transmitted on the first clock signal line 14 to the switching circuit 18. A second clock signal is transmitted on the second clock signal line 16 to the switching circuit 18. The clocking circuit 12 clocks when the signal on the first output line 20 is a relatively high voltage, such as a logic one, and also clocks when the signal on the second output line 36 is a relatively low voltage, such as a logic zero. The first clock signal is typically created by applying the primary clock signal and the quadrature clock signal discussed above to an AND gate, and the second clock signal is typically created by applying the primary clock signal and the quadrature clock signal to an OR gate.

The switching circuit 18 operates in two modes. In the first mode, the switching circuit 18 couples the first clock signal received on the first clock line 14 to the first output line 20 and couples the second clock signal received on the second clock line 16 to the second output line 36. This results in a double data rate clocking circuit, with the clocking circuit 12 clocking when the first clock signal is high and the second clock signal is low, which occurs twice per cycle of the primary clock.

In the second mode, the switching circuit 18 couples the steady state voltage, typically a relatively low voltage, to the first output line 20 and couples the second output line 36 to a third clock signal, typically the primary clock signal. This results in a single data rate clocking circuit with the clocking circuit 12 clocking only when the signal on the second output line is a relatively low voltage. A single data rate clocking circuit can also be achieved by coupling a steady state voltage, typically a relatively high voltage, to the second output line 36, resulting in the clocking circuit 12 clocking only when the signal on the first output line 20 is a relatively high voltage. Again, the primary clock signal may be used as the clock signal applied to the first output line 20.

Figure 4:
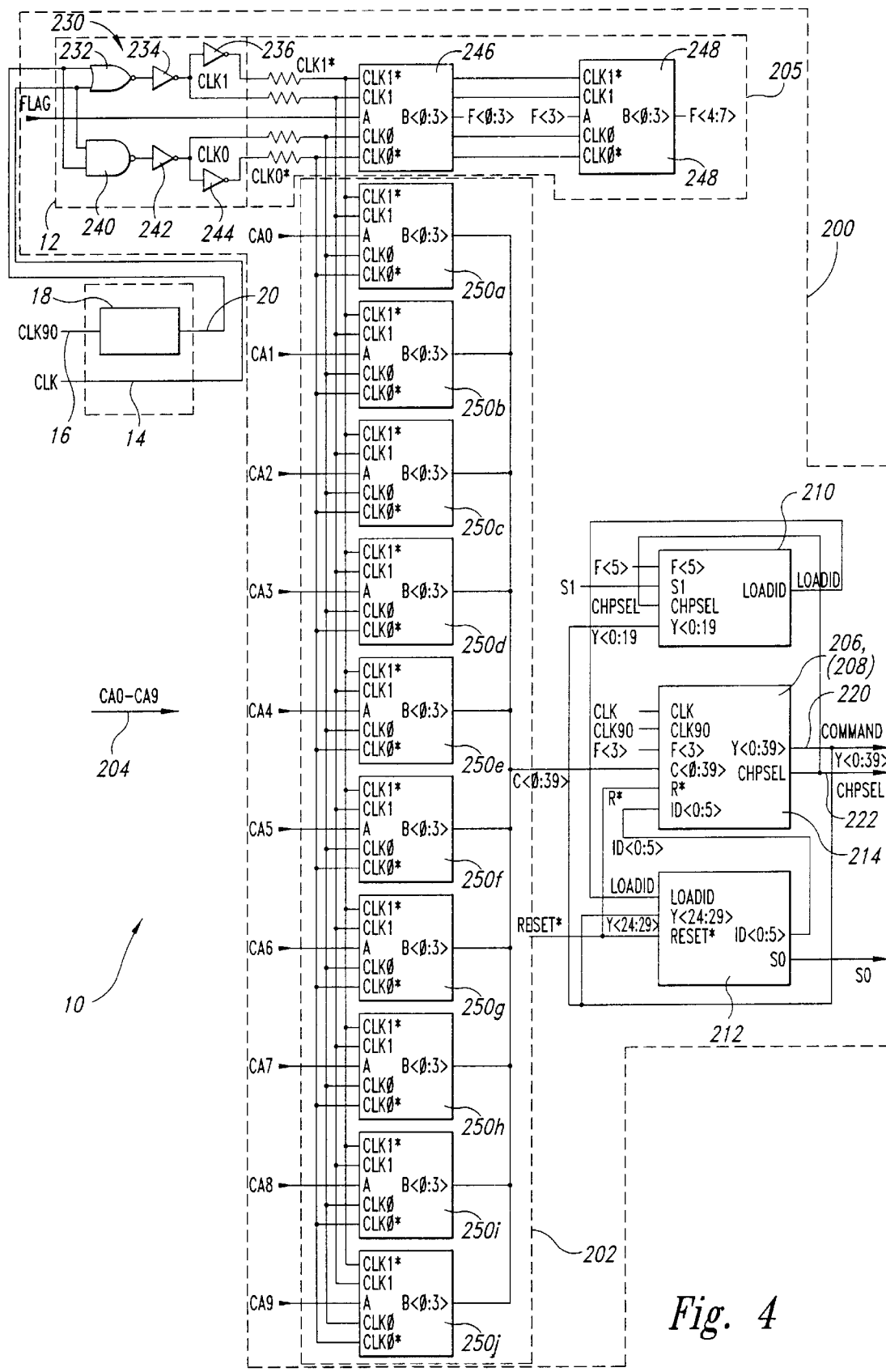
FIG. 4 is a functional block diagram showing the data rate control circuit of FIG. 1 used in a memory device command buffer.

In one embodiment of the invention, shown in FIG. 4, the data rate control circuit 10 may be used in a command buffer 200 in a memory device 17 (not shown). 5.In this embodiment, the switching circuit 18 drives a series of shift registers 246–250.

With reference to FIG. 4, a command packet CA consisting of a plurality of packet words are applied to a shift register 202 via a command data bus 204. The width M of the bus 204 corresponds to the size of the shift register 202, and the number N of packet words in the command packet corresponds to an integer sub-multiple of the number of stages of the shift register 202. In the embodiment shown in FIG. 5, the shift register 202 has one-half the number of stages that are in the command packet, i.e., two shift stages since there are four packet words. Thus, the shift register 202 sequentially receives two groups of two 10-bit packet words responsive to a clock signal CLK. Coincident with the start of a four word command packet, a FLAG signal is applied to a control circuit 205 that is clocked by the CLK signal along with the shift register 202.

After two packet words have been shifted into the shift register 202, the control circuit 205 generates a LOAD1 signal that is applied to a first storage register 206. The first storage register 206 then loads the first two packet words from the shift register 202. After two more packet words have been shifted into the shift register 202, the control circuit 205 generates a LOAD2 signal that is applied to a second storage register 208. The second storage register 208 then loads the remaining two packet words from the shift register 202. The first and second storage registers 206, 208 then collectively output a 40-bit command word COMMAND on a command bus 220.

The command buffer 200 also includes a comparator 214 that selectively generates a CHPSEL signal on line 222. The CHPSEL signal, when active high, causes the memory device containing the command buffer 200 to perform one of several functions corresponding to one or more of the COMMAND signals on the command bus 220.

In the embodiment shown in FIG. 4 in which two sets of two 10-bit command words are shifted into the shift register 202, the first and second storage registers 206, 208 receive and store 40 bits of command words. However, in the more general case, the shift register 202 has N/Y stages, each of which has a width of M bits, and Y storage registers 206, 208 each load N/Y M-bit command words. In an example where M is 8, and Y and N are both 4, the shift register 202 has a single stage having a width of 8 bits, and 4 storage registers each load 1 8-bit command word. Also, in the embodiment shown in FIG. 4, each of the command words is shifted through two stages of the shift register 202 each CLK cycle.

After the first storage register 206 has been loaded, it continuously outputs the first two packet words to an initialization decoder 210, an ID register 212, and a comparator 214. The function of the decoder 210, ID register 212, and comparator 214 is to examine the ID portion of the first packet word and determine whether the command packet is intended for the memory device containing the command buffer 200. More specifically, the command buffer 200 is programmed with a unique identifying code included in an initialization packet during an initialization routine. A portion of an initialization packet output from the storage register 208 is applied to the decoder 210, and another portion is applied to the ID register 212. The portion of the initialization packet is recognized by the decoder 210, which then generates a latch signal that causes the ID register 212 to store the other portion of the initialization packet. The portion of the initialization packet stored in the ID register 212 then uniquely identifies the memory device containing the command buffer 200. Thus, the portion of the initialization packet decoded by the decoder 210 is the same for all memory devices, while the portion of the initialization packet applied to the ID register 212 is different for each memory device. (During the initialization, means are provided to prevent all of the memory devices from simultaneously responding to the initialization packet, as explained below.) After initialization, the ID register 212 contains identifying data that is unique to the memory device that contains the command buffer 200.

After the identifying data have been stored in the ID register 212 during initialization, the memory device 17 (not shown) containing the command 15 buffer 200 receives command packets to transfer data into and out of the memory device. An ID portion of the packet word applied to the memory device and stored in the storage register 206 is applied to the comparator 214. The comparator 214 then compares the ID portion of the packet word to the identifying data stored in the ID register 212. In the event of a match, the comparator 214 generates an active CHPSEL signal that causes the memory device to carry out the operation corresponding to the COMMAND on the command bus 220. Significantly, the comparator 214 is able to compare the ID portion of the command packet to the identifying data stored in the ID register 212 after only two of the packet words have been shifted into the shift register 202 since the ID portion is in the first packet word of the command packet, as shown in FIG. 2. Furthermore, the command buffer 200 is able to start decoding the first three command bits after the first two packet words have been shifted into the shift register 202. By processing a portion of the command packet before the entire command packet has been received by the command buffer 200, the command buffer is able to more rapidly complete processing of the command packet.

With further reference to FIG. 4, the switching circuit 18 receives a quadrature clock signal CLK90 at its input 16, and its output 20 is coupled to one input of a NOR gate 232 and one input of aNAND gate 240. The other input to the NOR gate 232 and the NAND gate 240 receive the CLK signal on line 14.

1The control circuit 205 also includes a pair of shift registers 246, 248 that are connected in series with each other to form an 8-stage shift register. The shift register 246 receives the FLAG signal and sequentially shifts it through the four stages of the shift register circuit 246 and then through the four stages of the shift register circuit 248 responsive to the CLK0, CLK0*, CLK1, and CLK1* signals. The FLAG signal is shifted through two stages of the shift register circuits 246, 248 each cycle of the CLK signals. Thus, when FLAG goes high, two successive F<7:0> outputs of the shift register circuits 246, 248 sequentially go high each clock cycle.

The shift register 202 shown in FIG. 4 includes ten separate shift register circuits 250a–j, each of which receive a respective bit CA0–CA9 of the incoming 10-bit packet word. As explained further below, each of the shift register circuits 250a–j includes two shift register stages. Thus, after each clock cycle, two command bits CA have been shifted into each shift register circuit 250, and these bits are available as a 2-bit word B<1:0>. Thus, the ten shift register circuits 250a–j collectively output 20 bits of the command packet.

Figure 5:
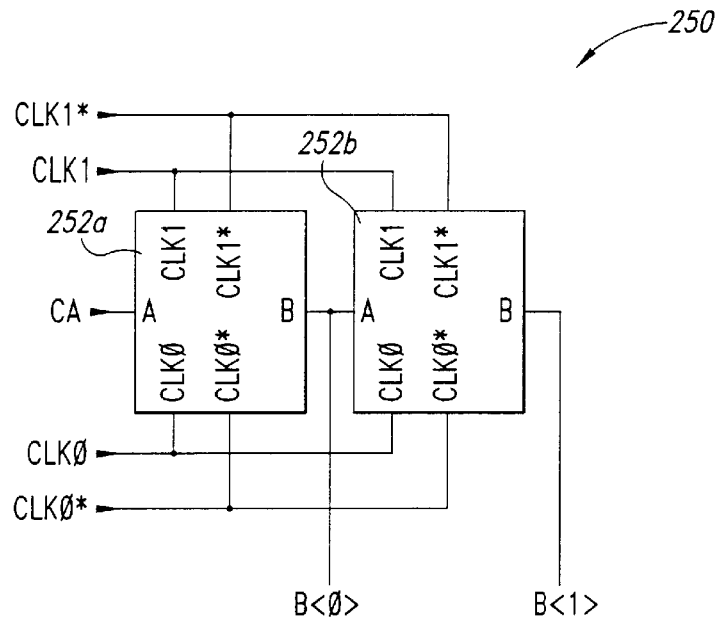
FIG. 5 is a logic diagram of one of the shift register circuits used in the command buffer shown in FIG. 4.

As explained above with reference to FIG. 4, the shift register 202 includes ten separate shift register circuits 250a–j, each of which receive a respective bit CA0–CA9 of the incoming 10-bit packet word. As illustrated in FIG. 5, each of the shift registers 250a–j includes two shift register stages 252a,b. The first stage 252a receives the packet word bit CA, and its output is connected to the input of the second stage 252b and to an external output B<0>.

The output of the second stage 252b is connected to an external output B<1>. Transfer from the input to the output of each stage 252a, b is in response to four clock signals CLK0, CLK0*, CLK1, CLK1* as explained in greater detail below. After two clock cycles, two command word bits CA have been shifted into the shift register stages 252a,b and both of these bits are available as a 2-bit word B<1:0>. Thus, the ten shift register circuits 250a–j collectively output two 10-bit command words.

Figure 6:
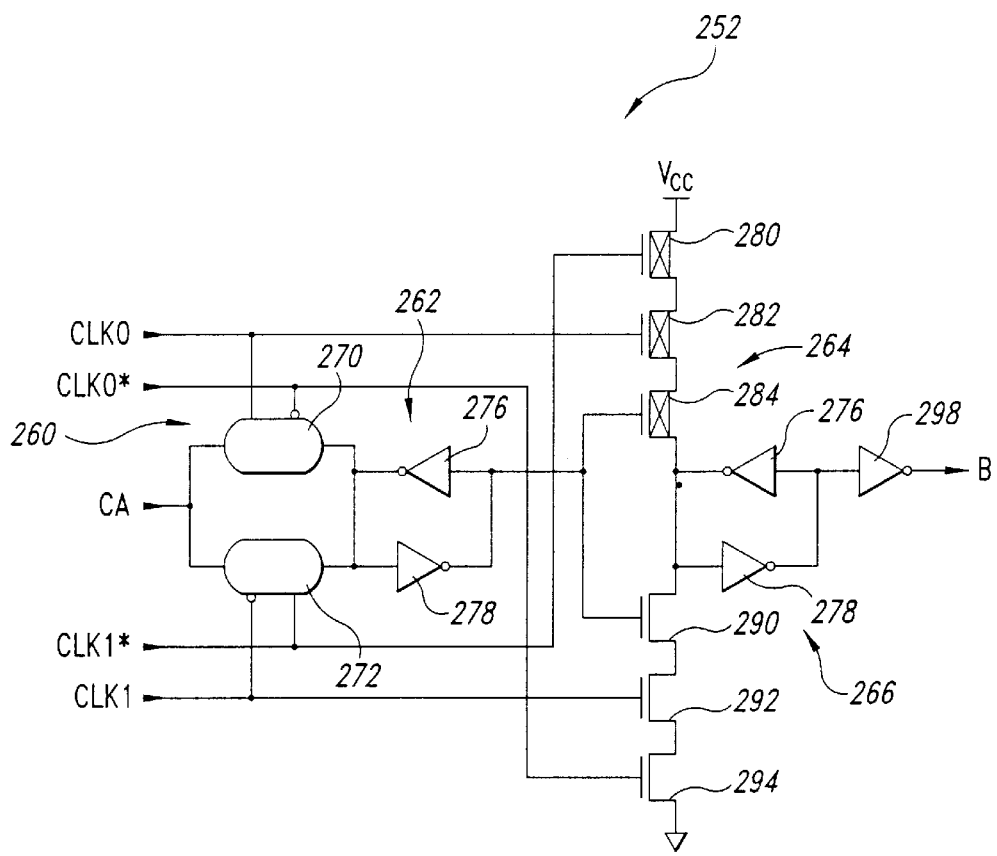
FIG. 6 is a schematic and logic diagram of a shift register stage used in the shift register circuit of FIG. 5.

Each of the shift register stages 252 is shown in greater detail in FIG. 6. Each of the shift register stages 252 includes a first transfer gate 260, a second transfer gate 264, and a second latch 266. The transfer gate 260 includes a first pass gate 270 operated by the CLK0 and CLK0* signals and a second pass gate 272 in parallel with the first pass gate 270 and operated by the CLK1 and CLK1* signals. The first latch 262 and the second latch 266 are each formed by a pair of inverters 276, 278 connected input-to-output. The second transfer gate 264 is formed by three PMOS transistors 280, 282, 284 connected between a supply voltage and the input to the second latch 266. The second transfer gate 264 also includes three NMOS transistors 290, 292, 294 connected in series between the input to the second latch 266 and ground. As explained below, the second transfer gate 264 inverts the signal from the first latch 262. Therefore, to restore the correct phasing of the command signals CA, an inverter 298 is provided at the output of the second latch 266.

Each of the pass gates 270, 272 is formed by an NMOS transistor and a PMOS transistor (not shown) connected in parallel with each other with the gate of the NMOS transistor being coupled to the non-inverting input and the gate of the PMOS transistor coupled to the inverting input.

The operation of the shift register stage 252 shown in FIG. 6 is best explained with reference to the timing diagram of FIG. 7. The pass gate 270 is conductive whenever the CLK0 signal is high and the CLK0* signal is low. Thus, the pass gate 270 is conductive for a short period each clock cycle, as shown by the line segments adjacent the 270 COND designation in FIG. 7. Similarly, the pass gate 272 is conductive whenever the CLK1 signal is low and the CLK1* signal is high. As shown by the line segments in FIG. 8, the pass gate 272 is conductive for a short period each clock cycle, with the conductive period of the pass gate 270 being equally spaced from the conductive period of the pass gate 272. Thus, the first transfer gate 260 is conductive twice each clock cycle, with each conductive period followed by a period of non-conductivity. Each time the transfer gate 260 is conductive, the inverse of the command bit CA is output from the latch 262 to the second transfer gate 264.

The function of the second transfer gate 264 is to couple the input to the second latch 266 to either $V_{cc}$ or ground at the proper time depending upon the value at the output of the first latch 262. The PMOS transistors 280, 282 are conductive whenever CLK0 and CLK1* are both low, which occurs at times designated by the line segments adjacent the "PMOS" designation in FIG. 7. The NMOS transistors 292, 294 are both conductive whenever the CLK1 signal and the CLK0* signal are both high, which occurs twice each clock cycle at the times designated by the line segments adjacent "NMOS" in FIG. 8. Thus, the PMOS transistors 280, 282 and the NMOS transistors 292, 294 are all conductive at the same times, and these periods of conductivity alternate with the periods of conductivity of the first transfer gate 260. The input to the second latch 260 is coupled to either $V_{cc}$ or ground during these periods of conductivity depending upon whether the output of the first latch 262 turns ON the PMOS transistor 284 or the NMOS transistor 290. More specifically, if the output of the first latch 262 is high, the NMOS transistor 290 will turn ON, thereby applying a low to the input of the second latch 266. If the output of the first latch 262 is low, the PMOS transistor 284 will turn ON, thereby applying a high to the input of the second latch 266. Thus, the second transfer gate 264 couples the inverted output of the first latch 262 to the input of the second latch 266.

During the time that the second transfer gate 264 is conductive, the second latch 266 outputs a signal that is the same as the output of the first latch 262 which, after passing through the inverter 298, is the same phase as the incoming command bit CA. The operation of the latch circuit 250 is shown using a command bit CA, which is initially high, but goes low shortly after $t_o$. During the next conductive period of the first transfer gate 260 at time $t_1$, the high command bit CA is transferred to the output of the first latch 262 in inverted form as shown in FIG. 7. During the next conductive period of the second transfer gate 264, the high at the output of the latch 262 is coupled to the output of the latch 266, thereby causing the output to go low at time $t_2$. Shortly thereafter, the command bit CA goes high. At the next conductive period of the first latch 260 at time $t_3$, this high is coupled through the first latch 260, thereby causing the output of the second latch 262 to go low. On the next conductive period of the second transfer gate 264 at time $t_4$, the high output of the first latch 262 is coupled to the output of the second latch 266, thereby causing the output to go high. Thus, a command bit coupled to the shift register stage 252 is shifted to the output of the shift register stage 252 less than one clock cycle later. On the next half clock cycle, the command bit is shifted to the output of the next shift register stage until one clock cycle has elapsed, at which time two command bits have been shifted into each shift register circuit 250. Thus, two command bits are shifted through each shift register circuit 250 each clock cycle.

With reference to FIG. 4, when the switching circuit 18 couples the first output line 20 to the second clock signal line 16, the shift register 250 functions as a double data rate circuit as described above. When, however, the switching circuit 18 couples the first output line 20 to the voltage source $V_1$ the shift register 250 functions as a single data rate circuit as described below.

If, for example, the first voltage source $V_1$ is ground, the output of the NAND gate 240 will be high, and the output of an inverter 242 will be low. Thus, the CLK0 signal will be biased low, while the CLK0* signal, created by passing the CLK0 signal through an inverter 244, will be biased high.

Because the first output line 20 is grounded, the output of the NOR gate 232 will be high when the CLK signal is low and will be low when the CLK signal is high. The output of an inverter 234 will thus be high when the CLK signal is high, and will be low when the CLK signal is low. In effect, the inverter 234 outputs the CLK signal. Thus, the CLK1 signal, which is generated at the output of the inverter 234, will be the same as the CLK signal, while the CLK1* signal, formed by passing the CLK1 signal through an inverter 236 will be the complement of the CLK signal.

The operation of the shift register stage 252 with the first output line 20 coupled to ground is best explained with reference to the timing diagram of FIG. 8. As mentioned above, the pass gate 270 is conductive whenever the CLK0 signal is high and the CLK0* signal is low. Thus, because the CLK0 signal is biased low, the CLK0* signal will be biased high, and the pass gate 270 is not conductive. Similarly, the pass gate 272 is conductive whenever the CLK1 signal is low and the CLK1* signal is high. As shown by the line segments in FIG. 8, the pass gate 272 is conductive for a short period each clock cycle. Thus, the first transfer gate 260 is conductive once each clock cycle, with the conductive period followed by a period of non-conductivity.

Figure 8:
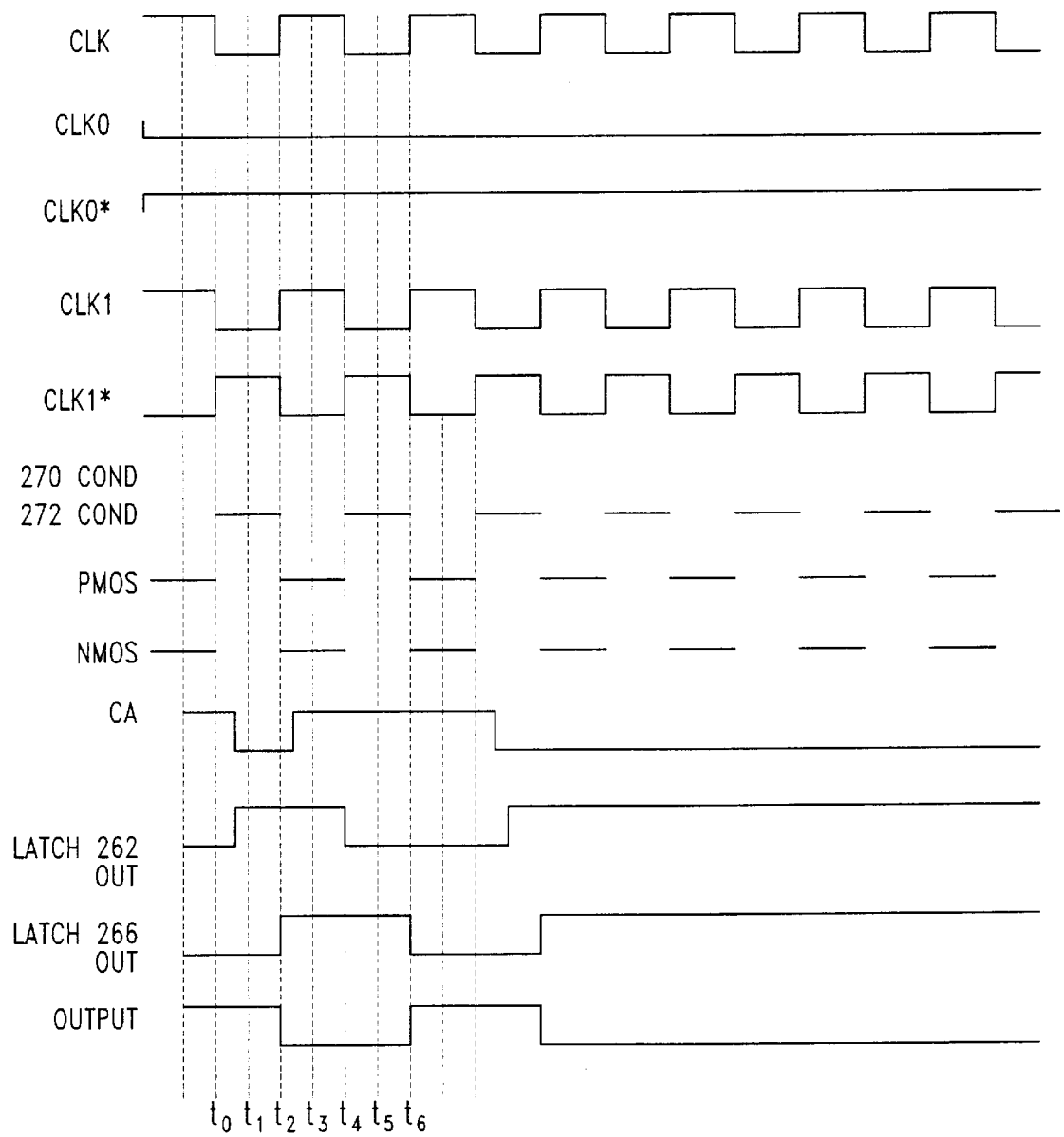
FIG. 8 is another timing diagram showing various signals present in the shift register of FIG. 6 when operating in a single data rate mode.

The PMOS transistors 280, 282 are conductive whenever CLK0 and CLK1* are both low, which occurs at times designated by the line segments adjacent the "PMOS" designation in FIG. 8. The NMOS transistors 292, 294 are both conductive whenever the CLK1 signal and the CLK0* signal are both high, which occurs once each clock cycle at the times designated by the line segments adjacent "NMOS" in FIG. 8. Thus, the PMOS transistors 280, 282 and the NMOS transistors 292, 294 are all conductive at the same times, and these periods of conductivity alternate with the periods of conductivity of the first transfer gate 260. The remainder of the elements of the shift register stage 252 function similarly to that described above, and will not be repeated in the interest of brevity.

With reference to FIG. 8, the operation of the latch circuit 250 is shown using a command bit CA, which is initially high, but goes low shortly after $t_0$. Because the first transfer gate 260 is conductive, the high command bit CA is immediately transferred to the output of the first latch 262 in inverted form as shown in FIG. 8. During the next conductive period of the second transfer gate 264, the high at the output of the latch 262 is coupled to the output of the latch 266, thereby causing the output to go low at time $t_2$. Shortly thereafter, the command bit CA goes high. At the next conductive period of the first latch 260 at time $t_4$, this high is coupled through the first latch 260, thereby causing the output of the second latch 262 to go low. On the next conductive period of the second transfer gate 264 at time $t_6$, the high output of the first latch 262 is coupled to the output of the second latch 266, thereby causing the output to go high. The shift register stage 252 outputs the first command bit for a full clock cycle until it is overwritten by a new command bit at time $t_6$. Thus, only one command bit may be shifted through each shift register stage 252 per clock cycle: half the rate that the shift register operates at in double data rate mode, described above.

Thus, when the switching circuit 18 couples the first output line 20 to ground, the stage 252 of the shift register 250 clocks at half the rate (once per clock cycle for each transfer gate 260, 264) it would clock at if the switching circuit 18 coupled the first output line 20 to the second clock signal.

The results discussed above can be similarly effected by coupling the first output line 20 to $V_{cc}$. The switching circuit 18 and the stage 252 of the shift register stage 250 function analogously to that described above, and further description is omitted in the interest of brevity.

The command buffer 200 may be substituted for the command buffer 46 in the memory device 17, shown in FIG. 9, described generally below.

Figure 9:
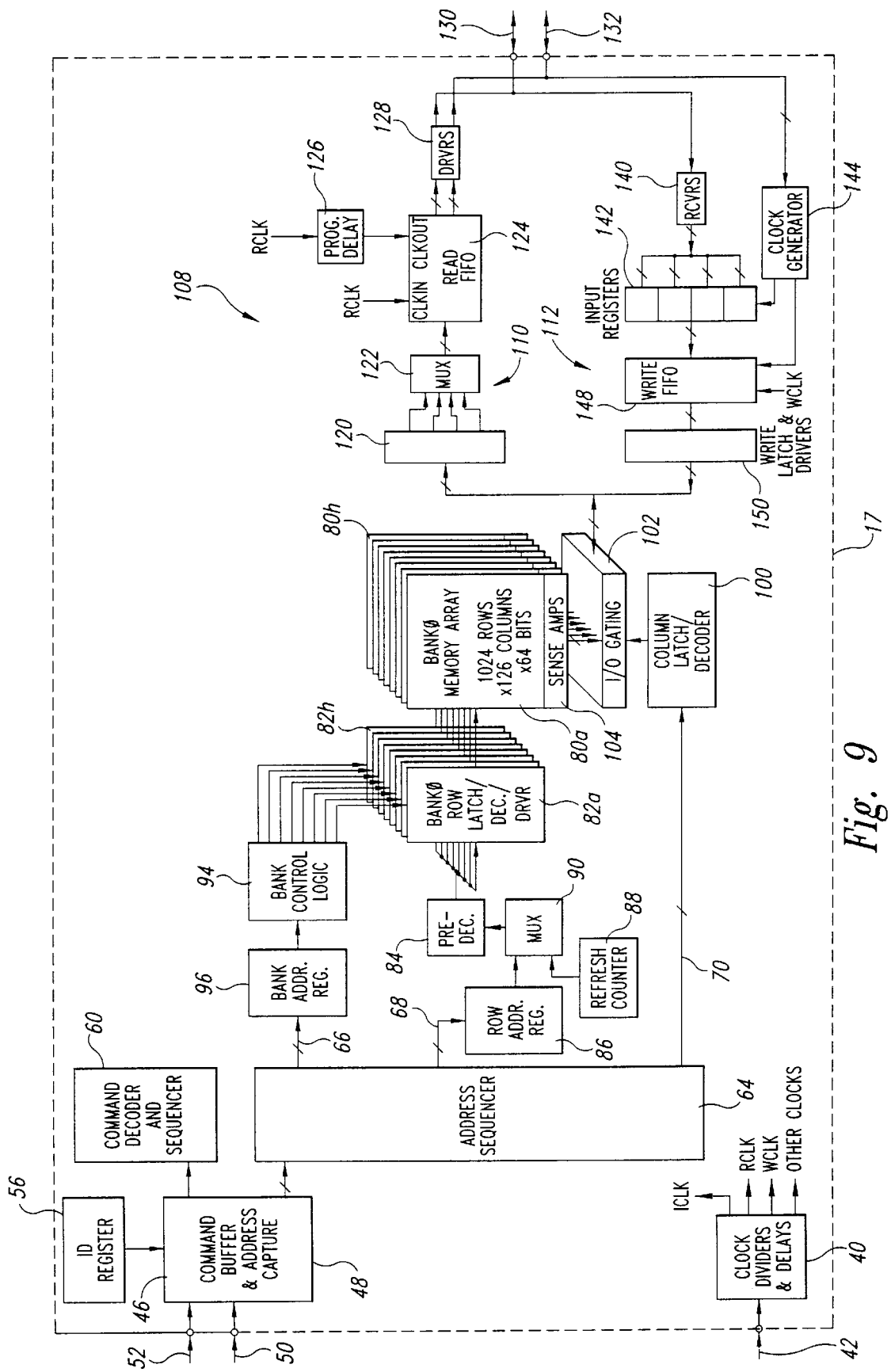
FIG. 9. is a block diagram of a packetized DRAM using the command buffer shown in FIGS. 4–6.

The memory device 17 is shown in block diagram form in FIG. 9. The memory device 17 includes a clock divider and delay circuit 40 that receives a master clock signal 42 and generates a large number of other clock and timing signals to control the timing of various operations in the memory device 17. The memory device 17 also includes a command buffer 46 and an address capture circuit 48, which receive an internal clock CLK signal, a command packet CA0–CA9 on a command bus 50, and a FLAG signal on line 52. The command packet contains control and address information for each memory transfer, and the FLAG signal identifies the start of a command packet. The command buffer 46 receives the command packet from the bus 50, and compares at least a portion of the command packet to identifying data from an ID register 56 to determine if the command packet is directed to the memory device 17 or some other memory device (not shown). If the command buffer 46 determines that the command is directed to the memory device 17, it then provides the command to a command decoder and sequencer 60.

The command decoder and sequencer 60 generates a large number of internal control signals to control the operation of the memory device 17 during a memory transfer corresponding to the memory command. More specifically, the command decoder and sequencer 60 operates in a pipelined fashion by storing memory commands corresponding to respective command packets as the command packets are received. In fact, the command decoder and sequencer 60 may receive and store memory commands a rate that is faster than the rate that the memory commands can be processed. The command decoder and sequencer 60 subsequently issues command signals corresponding to the respective memory commands at respective times that are determined by a latency command. The latency command specifies the number of clock pulses or clock edges that will occur between than the start and the resultant clocking of data into or out of the memory device 17. The latency command may be programmed into the memory device 17 by conventional means, such as by programming an anti-use. However, the latency command they also be part of an initialization packet that is received by the memory device 17 upon initialization.

The address capture circuit 48 also receives the command packet from the command bus 50 and outputs a 20-bit address corresponding to the address information in the command. The address is provided to an address sequencer 64 which generates a corresponding 3-bit bank address on bus 66, an 11-bit row address on bus 68, and a 6-bit column address on bus 70.

One of the problems of conventional DRAMs is their relatively low speed resulting from the time required to precharge and equilibrate circuitry in the DRAM array. The packetized memory device 17 shown in FIG. 9 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108, which includes a read data path 110 and a write data path 112. The read data path 110 includes a read latch 120 receiving and storing data from the I/O gating circuit 102. In the memory device 17 shown in FIG. 9, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device such as the processor 12 reading the data on the data bus 130 can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifier 104.

Figure 10:
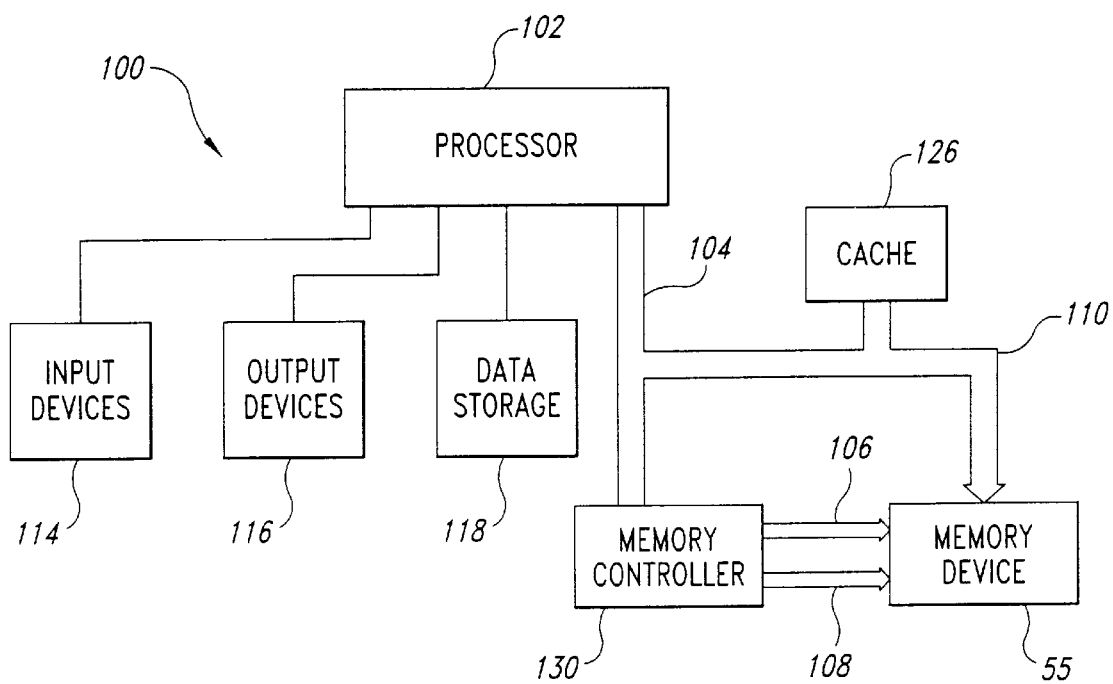
FIG. 10 is a block diagram showing the packetized DRAM of FIG. 9 used in a computer system.

FIG. 10 is a block diagram of a computer system 100 which includes the memory device 17 of FIG. 9. The computer system 100 includes a processor 102 for performing various computing functions, such as executing specific software to perform specific calculations or tasks. The processor 102 includes a processor bus 104 that normally includes an address bus 106, a control bus 108, and a data bus 110. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM") and to the memory device 17 through a memory controller 130. The memory controller 130 normally includes the control bus 108 and the address bus 106 that is coupled to the memory device 17. The data bus 110 may be coupled to the processor bus 104 either directly (as shown), through the memory controller 130, or by some other means.

From the foregoing it will be appreciated that, although specific embodiments of the invention have been described herein for purposes of illustration, various modifications may be made without deviating from the spirit and scope of the invention. For example, although the data rate control circuit 10 has been explained primarily for use in a memory device 17, it will be understood that it may also be used in other types of devices. Accordingly, the invention is not limited except as by the appended claims.

What is claimed is:

1. A data rate control circuit, comprising:
   a first clock line receiving a first clock signal that transitions between a pair of logic levels, the first clock signal having a first frequency and a first phase;
   a second clock line receiving a second clock signal, the second clock signal having the first frequency and a second phase;
   a switching circuit coupled to the second clock line to receive the second clock signal, the switching circuit operative in a first mode to couple the second clock line to an output line, and operative in a second mode to couple a steady state voltage to the output line; and
   a clocking circuit coupled to the first clock line and the output line, the clocking circuit structured to clock on transitions of the first clock signal to both logic levels in response to receiving the second clock signal on the output line, and clocking on transitions of the first clock signal to only one logic level in response to receiving the steady state voltage on the output line.

2. The data rate control circuit of claim 1 wherein the clocking circuit comprises a circuit that performs a predetermined function each time the clocking circuit clocks.

3. The data rate control circuit of claim 1 wherein the clocking circuit comprises a shift register.

4. The data rate control circuit of claim 1 wherein the clocking circuit comprises a counter latch.

5. The data rate control circuit of claim 1 wherein the one logic level comprises a logic one logic level.

6. The data rate control circuit of claim 1 wherein the clocking circuit comprises a circuit that clocks on transitions of the first clock signal to a logic one logic level in response to receiving the steady state voltage on the output line.

7. The data rate control circuit of claim 1 wherein the clocking circuit comprises a circuit that clocks on only transitions of the first clock signal to a logic zero logic level in response to receiving the steady state voltage on the output line.

8. The data rate control circuit of claim 1 wherein the steady state voltage comprises a positive voltage.

9. The data rate control circuit of claim 1 wherein the steady state voltage comprises zero volts.

10. The data rate control circuit of claim 1 wherein the switching circuit comprises a switching element.

11. The data rate control circuit of claim 1 wherein the switching circuit comprises an antifuse.

12. The data rate control circuit of claim 1 wherein the switching circuit comprises a transistor.

13. A data rate control circuit, comprising
   a first clock line receiving a first clock signal, the first clock signal having a first frequency, a first phase, a first edge, and a second edge;
   a second clock line receiving a second clock signal, the second clock signal having the first frequency, a second phase, and a first duty cycle;
   a duty cycle changing circuit coupled to the second clock line and having an output line, the duty cycle changing circuit receiving the second clock signal and a reference signal, the reference signal having a second duty cycle, the duty cycle changing circuit operative in a first mode to couple the second clock line to the output line, and operative in a second mode to couple the reference signal to the output line; and
   a clocking circuit coupled to the first clock line and the output line, the clocking circuit structured to clock on both edges of the first clock signal in response to receiving a signal on the output line having the first duty cycle and structured to clock on only one edge of the first clock signal in response to receiving a signal on the output line having the second duty cycle.

14. The date rate control circuit of claim 13 wherein the first duty cycle is 50% and the second duty cycle is 100%.

15. The date rate control circuit of claim 13 wherein the first duty cycle is 50% and the second duty cycle is 0%.

16. The data rate control circuit of claim 13 wherein the clocking circuit comprises a circuit that performs a predetermined function each time the clocking circuit clocks.

17. The data rate control circuit of claim 13 wherein the clocking circuit comprises a shift register.

18. The data rate control circuit of claim 13 wherein the clocking circuit comprises a counter latch.

19. The data rate control circuit of claim 13 wherein the first edge is a rising edge and the second edge is a falling edge.

20. The data rate control circuit of claim 13 wherein the first edge is a rising edge and the second edge is a falling edge, and the clocking circuit comprises a circuit that clocks on only the rising edge of the first clock signal in response to receiving a signal on the output line having the second duty cycle.

21. The data rate control circuit of claim 13 wherein the first edge is a rising edge and the second edge is a falling edge, and the clocking circuit comprises a circuit that clocks on only the falling edge of the first clock signal in response to receiving a signal on the output line having the second duty cycle.

22. The data rate control circuit of claim 13 wherein the duty cycle changing circuit comprises a switching element.

23. The data rate control circuit of claim 13 wherein the duty cycle changing circuit comprises an antifuse.

24. The data rate control circuit of claim 13 wherein the duty cycle changing circuit comprises a transistor.

25. A data rate control circuit, comprising
- a first clock line receiving a first clock signal, the first clock signal having a first frequency, a first phase, a first edge, and a second edge;
- a second clock line receiving a second clock signal, the second clock signal having the first frequency, and a second phase;
- a frequency changing circuit coupled to the second clock line and having an output line, the switching circuit receiving the second clock signal and a reference signal, the reference signal having a second frequency, the switching circuit operative in a first mode to couple the second clock line to the output line, and operable in a second mode to couple the reference signal to the output line; and
- a clocking circuit coupled to the first clock line and the output line, the clocking circuit structured to clock on both edges of the first clock signal in response to receiving a signal on the output line having the first frequency, and clocking on only one edge of the first clock signal in response to receiving a signal on the output line having the second frequency.

26. The date rate control circuit of claim 25 wherein the first frequency is a positive number.

27. The date rate control circuit of claim 25 wherein the second frequency is zero.

28. The data rate control circuit of claim 25 wherein the clocking circuit comprises a circuit that performs a predetermined function each time the clocking circuit clocks.

29. The data rate control circuit of claim 25 wherein the clocking circuit comprises a shift register.

30. The data rate control circuit of claim 25 wherein the clocking circuit comprises a counter latch.

31. The data rate control circuit of claim 25 wherein the first edge is a rising edge and the second edge is a falling edge.

32. The data rate control circuit of claim 25 wherein the first edge is a rising edge and the second edge is a falling edge, and the clocking circuit comprises a circuit that clocks on only the rising edge of the first clock signal in response to receiving a signal on the output line having the second frequency.

33. The data rate control circuit of claim 25 wherein the first edge is a rising edge and the second edge is a falling edge, and the clocking circuit comprises a circuit that clocks on only the falling edge of the first clock signal in response to receiving a signal on the output line having the second frequency.

34. The data rate control circuit of claim 25 wherein the frequency changing circuit comprises a switching element.

35. The data rate control circuit of claim 25 wherein the frequency changing circuit comprises an antifuse.

36. The data rate control circuit of claim 25 wherein the frequency changing circuit comprises a transistor.

37. A data rate control circuit, comprising:
- a first clock line receiving a first clock signal, the first clock signal having a first frequency, a first phase, a first edge, and a second edge;
- a second clock line receiving a second clock signal, the second clock signal having the first frequency and a second phase;
- a fuse having a first end and a second end, the first end coupled to the second clock signal line;
- an antifuse having a first side and a second side, the first side coupled to a steady state voltage source and the second side coupled to the second end of the fuse; and
- a clocking circuit coupled to the first clock line and to the second side of the antifuse, the clocking circuit structured to clock on both edges of the first clock signal in response to receiving the second clock signal through the fuse, and clocking on only one edge of the first clock signal in response to receiving the steady state voltage through the antifuse.

38. The data rate control circuit of claim 37 wherein the clocking circuit comprises a circuit that performs a predetermined function each time the clocking circuit clocks.

39. The data rate control circuit of claim 37 wherein the clocking circuit comprises a shift register.

40. The data rate control circuit of claim 37 wherein the clocking circuit comprises a counter latch.

41. The data rate control circuit of claim 37 wherein the first edge is a rising edge and the second edge is a falling edge.

42. The data rate control circuit of claim 37 wherein the first edge is a rising edge and the second edge is a falling edge, and the clocking circuit comprises a circuit that clocks on only the rising edge of the first clock signal in response to receiving the steady state voltage on the output line.

43. The data rate control circuit of claim 37 wherein the first edge is a rising edge and the second edge is a falling edge, and the clocking circuit comprises a circuit that clocks on only the falling edge of the first clock signal in response to receiving the steady state voltage on the output line.

44. A data rate control circuit, comprising:
- a first clock line receiving a first clock signal, the first clock signal having a first frequency, a first phase, a first edge, and a second edge;
- a second clock line receiving a second clock signal, the second clock signal having the first frequency, a second phase, a third edge, and a fourth edge;
- a switching circuit coupled to the first clock line and the second clock line, the switching circuit having a first output line and a second output line, the switching circuit receiving the first clock signal on the first clock line, and the second clock signal on the second clock line, the switching circuit operative in a first mode to couple the first clock line to the first output line and to couple the second clock line to the second output line, and operative in a second mode to couple the first output line to a steady state voltage and to couple the second output line to a third clock signal, the third clock signal having the first frequency, a third phase, a fifth edge and a sixth edge;
- a clocking circuit coupled to the first output line and the second output line, the clocking circuit structured to clock when a signal on the first output line is a relatively high voltage and also structured to clock when a signal on the second output line is a relatively low voltage.

45. A memory device having an address bus, comprising:
- a memory array circuit comprising a plurality of memory cells arranged in rows and columns, a plurality of row lines, and at least one digit for each column of memory cells; and
- an addressing circuit coupled to the address bus and the memory array circuit, the addressing circuit adapted to receive row and column addresses on the address bus and activate a corresponding memory cell in the array responsive to a command word, the addressing circuit having a data rate control circuit, the data rate control circuit comprising:

a first clock line receiving a first clock signal that transitions between a pair of logic levels, the first clock signal having a first frequency and a first phase;

a second clock line receiving a second clock signal, the second clock signal having the first frequency and a second phase;

a switching circuit coupled to the second clock line to receive the second clock signal, the switching circuit operative in a first mode to couple the second clock line to an output line, and operative in a second mode to couple a steady state voltage to the output line; and a clocking circuit coupled to the first clock line and the output line, the clocking circuit structured to clock on transitions of the first clock signal to both logic levels in response to receiving the second clock signal on the output line, and clocking on transitions of the first clock signal to only one logic level in response to receiving the steady state voltage on the output line.

46. The memory device of claim 45 wherein the clocking circuit comprises a circuit that performs a predetermined function each time the clocking circuit clocks.

47. The memory device of claim 45 wherein the clocking circuit comprises a shift register.

48. The memory device of claim 45 wherein the clocking circuit comprises a counter latch.

49. The memory device of claim 45 wherein the one logic level comprises a logic one logic level.

50. The memory device of claim 45 wherein the clocking circuit comprises a circuit that clocks on transitions of the first clock signal to a logic one logic level in response to receiving the steady state voltage on the output line.

51. The memory device of claim 45 wherein the clocking circuit comprises a circuit that clocks on only transitions of the first clock signal to a logic zero logic level in response to receiving the steady state voltage on the output line.

52. The memory device of claim 45 wherein the steady state voltage comprises a positive voltage.

53. The memory device of claim 45 wherein the steady state voltage comprises zero volts.

54. The memory device of claim 45 wherein the switching circuit comprises a switching element.

55. The memory device of claim 45 wherein the switching circuit comprises an antifuse.

56. The memory device of claim 45 wherein the switching circuit comprises a transistor.

57. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory device coupled to the processor through the processor bus, the memory device comprising:

a memory array circuit comprising a plurality of memory cells arranged in rows and columns, a plurality of row lines, and at least one digit for each column of memory cells; and an addressing circuit coupled to an address bus and the memory array circuit, the addressing circuit adapted to receive row and column addresses on the address bus and activate a corresponding memory cell in the array responsive to a command word, the addressing circuit having a data rate control circuit, the data rate control circuit comprising:

a first clock line receiving a first clock signal that transitions between a pair of logic levels, the first clock signal having a first frequency and a first phase;

a second clock line receiving a second clock signal, the second clock signal having the first frequency and a second phase;

a switching circuit coupled to the second clock line to receive the second clock signal, the switching circuit operative in a first mode to couple the second clock line to an output line, and operative in a second mode to couple a steady state voltage to the output line; and a clocking circuit coupled to the first clock line and the output line, the clocking circuit structured to clock on transitions of the first clock signal to both logic levels in response to receiving the second clock signal on the output line, and clocking on transitions of the first clock signal to only one logic level in response to receiving the steady state voltage on the output line.

58. The computer system of claim 57 wherein the clocking circuit comprises a circuit that performs a predetermined function each time the clocking circuit clocks.

59. The computer system of claim 57 wherein the clocking circuit comprises a shift register.

60. The computer system of claim 57 wherein the clocking circuit comprises a counter latch.

61. The computer system of claim 57 wherein the one logic level comprises a logic one logic level.

62. The computer system of claim 57 wherein the clocking circuit comprises a circuit that clocks on transitions of the first clock signal to a logic one logic level in response to receiving the steady state voltage on the output line.

63. The computer system of claim 57 wherein the clocking circuit comprises a circuit that clocks on only transitions of the first clock signal to a logic zero logic level in response to receiving the steady state voltage on the output line.

64. The computer system of claim 57 wherein the steady state voltage comprises a positive voltage.

65. The computer system of claim 57 wherein the steady state voltage comprises zero volts.

66. The computer system of claim 57 wherein the switching circuit comprises a switching element.

67. The computer system of claim 57 wherein the switching circuit comprises an antifuse.

68. The computer system of claim 57 wherein the switching circuit comprises a transistor.

69. A method for controlling the data rate through a clocking circuit, the method comprising the steps of:

providing a first clock signal to the clocking circuit, the first clock signal having a first frequency, first phase, a first edge, and a second edge;

in a first mode, providing a second clock signal to the clocking circuit, the second clock signal having the first frequency and a second phase;

in a second mode, providing a steady state signal to the clocking circuit;

clocking on a first edge and a second edge of a first clock signal when the second clock signal is provided to the clocking circuit; and clocking on only one edge of the first clock signal when the steady state signal is provided to the clocking circuit.

* * * * *